US011467456B2

(12) United States Patent
Zhang et al.

(10) Patent No.: US 11,467,456 B2
(45) Date of Patent: Oct. 11, 2022

(54) ARRAY SUBSTRATE, DISPLAY PANEL AND DISPLAY APPARATUS

(71) Applicants: Chongqing BOE Optoelectronics Technology Co., Ltd., Chongqing (CN); BOE Technology Group Co., Ltd., Beijing (CN)

(72) Inventors: Pengyue Zhang, Beijing (CN); Zhulin Liu, Beijing (CN); Xiaolin Wang, Beijing (CN); Jungho Park, Beijing (CN); Zhuo Xu, Beijing (CN)

(73) Assignees: Chongqing BOE Optoelectronics Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 22 days.

(21) Appl. No.: 16/963,531

(22) PCT Filed: Dec. 17, 2019

(86) PCT No.: PCT/CN2019/125922
§ 371 (c)(1),
(2) Date: Jul. 21, 2020

(87) PCT Pub. No.: WO2020/147479
PCT Pub. Date: Jul. 23, 2020

(65) Prior Publication Data
US 2021/0157207 A1 May 27, 2021

(30) Foreign Application Priority Data
Jan. 17, 2019 (CN) .......................... 201910044401.X

(51) Int. Cl.
*G02F 1/1362* (2006.01)
*G02F 1/1343* (2006.01)
(Continued)

(52) U.S. Cl.
CPC .. *G02F 1/136286* (2013.01); *G02F 1/134309* (2013.01); *H01L 27/1244* (2013.01);
(Continued)

(58) Field of Classification Search
CPC ....... G09G 2300/00; G09G 2310/0286; G09G 2300/0408; G02F 1/134309; G02F 1/136286
See application file for complete search history.

(56) References Cited

U.S. PATENT DOCUMENTS 9,252,163 B1 2/2016 Song et al.
9,406,272 B2 8/2016 Lee et al.
(Continued)

FOREIGN PATENT DOCUMENTS

CN 102314003 A 1/2012
CN 102789757 A 11/2012
(Continued)

OTHER PUBLICATIONS

First Office Action, including Search Report, for Chinese Patent Application No. 20191004401.X, dated Mar. 20, 2020, 18 pages.

*Primary Examiner* — Mariam Qureshi
(74) *Attorney, Agent, or Firm* — Westman, Champlin & Koehler, P.A.

(57) ABSTRACT

Embodiments of the present disclosure provide an array substrate, a display panel, and a display apparatus. The array substrate includes: a display region for displaying an image; a non-display region; a shift register provided in the non-display region; a gate line provided in the display region and extending along a first direction; and a gate signal output line, provided in the non-display region and having a first end and a second end. The first end of the gate signal output line is connected to the shift register, and the second end of the gate signal output line is connected to the gate line at a
(Continued)

side of the gate line in a second direction perpendicular to the first direction.

17 Claims, 9 Drawing Sheets

(51) Int. Cl.
  *H01L 27/12* (2006.01)
  *G09G 3/36* (2006.01)
(52) U.S. Cl.
  CPC ... *G09G 3/3677* (2013.01); *G09G 2300/0408* (2013.01); *G09G 2310/0286* (2013.01)

(56) References Cited

U.S. PATENT DOCUMENTS

| | | | |
|---|---|---|---|
| 9,638,949 B1* | 5/2017 | Kim | G02F 1/136286 |
| 9,640,130 B2 | 5/2017 | Sugiyama | |
| 2012/0293467 A1 | 11/2012 | Lee et al. | |
| 2013/0056736 A1* | 3/2013 | Kim | G09G 3/3677 438/34 |
| 2013/0102115 A1* | 4/2013 | Yaneda | H01L 27/124 438/155 |
| 2015/0061985 A1 | 3/2015 | Sugiyama | |
| 2015/0331270 A1* | 11/2015 | Yokogawa | G02F 1/13306 349/42 |

FOREIGN PATENT DOCUMENTS

| | | |
|---|---|---|
| CN | 203733452 U | 7/2014 |
| CN | 104332475 A | 2/2015 |
| CN | 104424907 A | 3/2015 |
| CN | 105549288 A | 5/2016 |
| CN | 207517694 U | 6/2018 |
| CN | 109782502 A | 5/2019 |
| KR | 20080022702 A | 3/2008 |

\* cited by examiner

ARRAY SUBSTRATE, DISPLAY PANEL AND DISPLAY APPARATUS

CROSS-REFERENCE TO RELATED APPLICATION

This Application is a Section 371 National Stage Application of International Application No. PCT/CN2019/125922, filed on Dec. 17, 2019, which has not yet published, and claims priority to Chinese Patent Application No. 201910044401.X, filed on Jan. 17, 2019, the disclosures of which are incorporated herein by reference in their entireties.

TECHNICAL FIELD

Embodiments of the present disclosure relate to the field of display technology, and in particular, to an array substrate, a display panel including the array substrate, and a display apparatus including the display panel.

BACKGROUND

A display panel of a thin film transistor liquid crystal display (TFT-LCD) includes pixels arranged in an array, and each pixel in the display panel is driven by a driving circuit for display. The drive circuit includes a gate drive circuit. The gate drive circuit is usually implemented by a shift register. The shift register converts a clock signal into an on/off voltage and outputs it to each gate line of the display panel.

SUMMARY

Embodiments of the present disclosure provide an array substrate, comprising: a display region for displaying an image; a non-display region; a shift register provided in the non-display region; a gate line provided in the display region and extending along a first direction; and a gate signal output line, provided in the non-display region and having a first end and a second end, the first end of the gate signal output line being connected to the shift register, and the second end of the gate signal output line being connected to the gate line at a side of the gate line in a second direction perpendicular to the first direction.

According to embodiments of the present disclosure, the array substrate further comprises: a jumper pad, wherein the second end of the gate signal output line is connected to the jumper pad at a side of the jumper pad in the second direction, and the gate line is connected to the jumper pad at a side of the jumper pad away from the non-display region in the first direction.

According to embodiments of the present disclosure, the array substrate further comprises: a common electrode leading wire, provided in a same layer as the gate line, and extending in a direction crossing the gate line; and a gate insulating layer covering the common electrode leading wire and the gate line, the gate signal output line being provided on the gate insulating layer.

According to embodiments of the present disclosure, the gate signal output line comprises a lead-out section and a transfer section, and each of the lead-out section and the transfer section comprises a first end and a second end, the first end of the lead-out section is connected to the shift register, the second end of the lead-out section is connected to the first end of the transfer section, the second end of the transfer section is connected to the gate line through the jumper pad, and an angle between the transfer section and the gate line is within a range of 45° to 90°.

According to embodiments of the present disclosure, the array substrate further comprises: a common electrode leading wire, provided in a same layer as the gate line, and extending in a direction crossing the gate line, wherein the non-display region comprises a circuit region and a transfer region, the transfer region is located between the display region and the circuit region, the transfer section of the gate signal output line and the jumper pad are located in the transfer region, and the common electrode leading wire is provided in the transfer region.

According to embodiments of the present disclosure, the array substrate further comprises: a data line, provided in a same layer as the gate signal output line.

According to embodiments of the present disclosure, the gate signal output line further comprises an intermediate section, a first end of the intermediate section is connected to the second end of the lead-out section, a second end of the intermediate section is connected to the first end of the transfer section, and an angle between the intermediate section and the transfer section is within a range of 30° to 60°.

According to embodiments of the present disclosure, the intermediate section has a straight-line shape or an arc shape.

According to embodiments of the present disclosure, the array substrate further comprises: a jumper pad, comprising a first connection sheet and a second connection sheet, wherein the first connection sheet is connected to and provided in a same layer as the gate line, and the second connection sheet is connected to and provided in a same layer as the gate signal output line, and the first connection sheet and the second connection sheet are connected through a via hole formed in the gate insulating layer.

According to embodiments of the present disclosure, the jumper pad is located on a side of the common electrode leading wire facing the gate line in the first direction.

According to embodiments of the present disclosure, the second end of the gate signal output line is connected to the second connection sheet of the jumper pad at a side of the second connection sheet of the jumper pad in the second direction, and the gate line is connected to the first connection sheet of the jumper pad at a side of the first connection sheet of the jumper pad away from the non-display region in the first direction.

According to embodiments of the present disclosure, in a direction perpendicular to the common electrode leading wire, a distance between an edge of the first connection sheet facing the common electrode leading wire and an edge of the common electrode leading wire facing the first connection sheet is greater than 12 μm.

According to embodiments of the present disclosure, a facing width between the first connection sheet and the common electrode leading wire is greater than 20 μm.

According to embodiments of the present disclosure, the gate signal output line comprises a lead-out section and a transfer section, each of the lead-out section and the transfer section comprises a first end and a second end, and the first end of the lead-out section is connected to the shift register, the second end of the lead-out section is connected to the first end of the transfer section, the second end of the transfer section is connected to the gate line through the jumper pad, and an angle between the transfer section and the gate line is within a range of 45° to 90°, and in a direction parallel to the common electrode leading wire, a distance between an edge of the second connection sheet facing the lead-out section and an edge of the lead-out section facing the second connection sheet is greater than 18 μm.

According to embodiments of the present disclosure, the array substrate further comprises: a connection line, provided in the non-display region and having a first end and a second end, wherein the first end of the connection line is connected to the gate line at a side of the gate line in the second direction perpendicular to the first direction, and the second end of the connection line is connected to the gate signal output line.

According to embodiments of the present disclosure, the array substrate further comprises: a jumper pad, wherein the second end of the gate signal output line and the second end of the connection line are respectively at opposite first and second sides of the jumper pad in the second direction, and connected to each other through the jumper pad.

According to embodiments of the present disclosure, the array substrate further comprises: a common electrode leading wire, provided in a same layer as the gate line, and extending in a direction crossing the gate line; a gate insulating layer covering the common electrode leading wire and the gate line, wherein the gate signal output line is provided on the gate insulating layer; and a jumper pad, comprising a first connection sheet and a second connection sheet, wherein the first connection sheet and the second connection sheet are connected through a via hole formed in the gate insulating layer, the second end of the gate signal output line is connected to the second connection sheet at a first side of the jumper pad in the second direction and the second connection sheet is provided in a same layer as the gate signal output line, and the second end of the connection line is connected to the first connection sheet at a second side, opposite to the first side, of the jumper pad in the second direction and the first connection sheet is provided in a same layer as the connection line and the gate line.

According to embodiments of the present disclosure, an angle between the connection line and the gate line is within a range of 45° to 90°.

According to embodiments of the present disclosure, the connection line comprises a first connection line portion and a second connection line portion, a first end of the second connection line portion of the connection line is connected to the gate line, and a second end of the second connection line portion of the connection line is connected to a first end of the first connection line portion of the connection line, and a second end of the first connection line portion of the connection line is connected to the first connection sheet of the jumper pad.

According to embodiments of the present disclosure, the array substrate further comprises: a data line, provided in a same layer as the gate signal output line, wherein the second connection line portion of the connection line is parallel to a portion of the data line that is opposite to the second connection line portion in the first direction and is located in a same range as the second connection line portion in the second direction.

According to embodiments of the present disclosure, the second connection line portion of the connection line has an arc shape.

According to embodiments of the present disclosure, the second connection line portion of the connection line has a straight-line shape, and an angle between the second connection line portion of the connection line and the first connection line portion is within a range of 30° to 60°, or the first connection line portion of the connection line and the gate line form an angle of 45° to 90° with each other.

According to embodiments of the present disclosure, a size of the jumper pad in the first direction is smaller than a size of the jumper pad in the second direction.

Embodiments of the present disclosure further provide a display panel, comprising the above array substrate.

Embodiments of the present disclosure further provide a display apparatus, comprising the above display panel.

Other features and advantages of the present disclosure will be explained in the embodiments of the specification as follows, and partly become obvious from the embodiments of the specification, or be understood by implementing the present disclosure. The objects and other advantages of the embodiments of the present disclosure can be realized and obtained by the structures particularly pointed out in the description, claims, and drawings.

BRIEF DESCRIPTION OF THE DRAWINGS

The drawings are used to provide a further understanding of the technical solutions of the present disclosure, and constitute a part of the specification, and are used to explain the technical solutions of the present disclosure together with the embodiments of the present application, and do not constitute limitations on the technical solutions of the present disclosure. The shapes and sizes of the components in the drawings do not reflect the true ratio, and the purpose is only to illustrate the contents of the present disclosure.

DETAILED DESCRIPTION OF EMBODIMENTS

Specific implementations of the present disclosure will be described in further detail below with reference to the accompanying drawings and embodiments. The following embodiments are used to illustrate the present disclosure, but not to limit the scope of the present disclosure. It should be noted that the embodiments in the present disclosure and the features in the embodiments can be arbitrarily combined with each other without conflict.

A display panel of a thin film transistor liquid crystal display (TFT-LCD) includes pixels arranged in an array, and a thin film transistor of each pixel in the display panel is driven by a driving circuit to display by the pixels. The drive circuit mainly includes a gate drive circuit and a data drive circuit. The data drive circuit is used to sequentially latch the input data according to the timing of the clock signal and convert the latched data into an analog signal, and then input it to each data line of the display panel. The gate drive circuit is usually implemented by a shift register. The shift register converts the clock signal into an on/off voltage and outputs it to each gate line of the display panel. At present, in order to adapt to the development trend of high resolution and narrow border of the display panel, Gate Driver on Array (GOA) technology is adopted. With the GOA technology, the shift register is directly integrated on the array substrate to replace the external driver chip. Each GOA unit acts as one level of shift register, and each level of shift register is connected to a gate line, and the turn-on voltage is sequentially output through each level of shift registers to realize the progressive scanning of pixels.

The inventor of the present application has found by research that in a structure where a gate signal output line of each level of shift register is connected to the gate line, there is a problem of a short circuit of the gate signal output line.

The inventor of the present application found by research that the cause of the short circuit problem of the gate signal output line in the related art is due to the occurrence of Electro-Static Discharge (ESD). The specific explanation is as follows.

Figure 1:
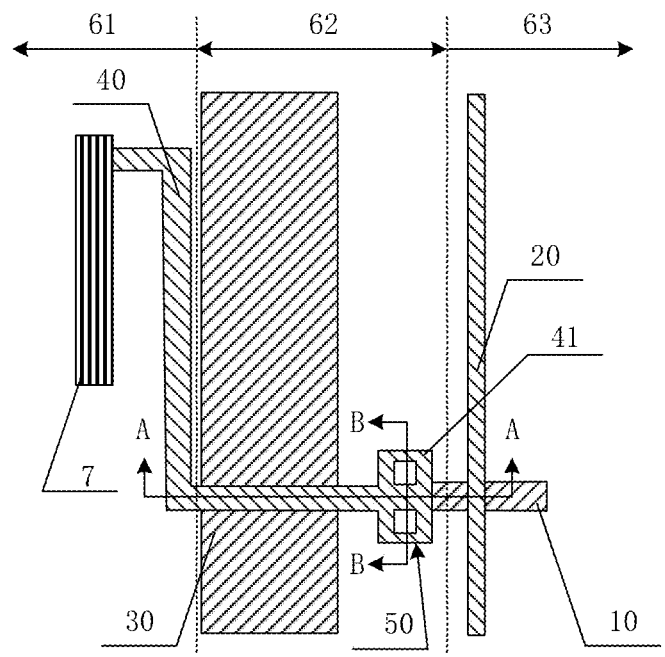
FIG. 1 is a schematic view of a structure where a gate signal output line is connected to a gate line in an array substrate in the related art.
Figure 2:
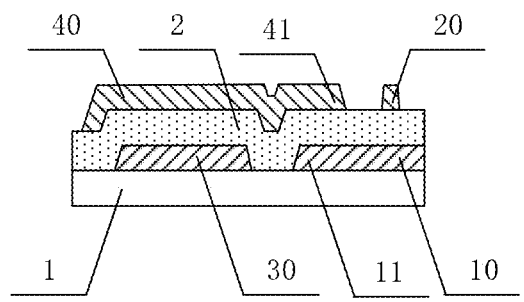
FIG. 2 is a cross-sectional view of the array substrate taken along an A-A direction in FIG. 1.
Figure 3:
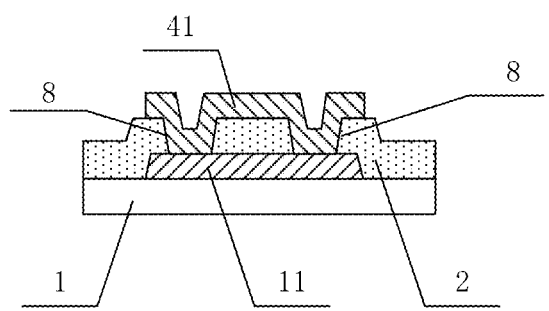
FIG. 3 is a cross-sectional view of the array substrate taken along a B-B direction in FIG. 1.

FIG. 1 is a schematic view of a structure where a gate signal output line is connected to a gate line in an array substrate in the related art; FIG. 2 is a cross-sectional view of the array substrate taken along an A-A direction in FIG. 1; and FIG. 3 is a cross-sectional view of the array substrate taken along a B-B direction in FIG. 1. For the sake of clarity, illustration of the gate insulating layer 2 is omitted in FIG. 1. As shown in FIG. 1, the array substrate includes a display region 63, a transfer region 62, and a circuit region 61. The transfer region 62 is disposed between the display region 63 and the circuit region 61. The display region 63 is provided with gate lines 10 and data lines 20, the gate lines 10 and the data lines 20 of the display region 63 are vertically crossed to form a plurality of pixels arranged in a matrix, and each pixel is provided therein with a thin film transistor TFT. The circuit region 61 is provided with a shift register 7 and a gate signal output line 40 connected to the shift register 7, and the shift register 7 outputs a turn-on voltage to the thin film transistor TFT through the gate signal output line 40. The transfer region 62 is provided with a common electrode leading wire 30 and a jumper pad 50. The jumper pad 50 is used to connect the gate signal output line 40 and the gate line 10. The common electrode leading wire 30 is perpendicular to the gate line 10 and parallel to the data line 20 for outputting a common voltage to the common electrode of the display region 63. As shown in FIGS. 2 to 3, the gate line 10 and the common electrode leading wire 30 are provided on the substrate 1 and are provided in the same layer. The gate line 10 is provided with a rectangular first connection sheet 11 at the end of the gate line 10 located in the transfer region 62. The gate insulating layer 2 covers the gate line 10, the first connection sheet 11 and the common electrode leading wire 30, and the gate insulating layer 2 is formed with two via holes 8 exposing the first connection sheet 11. The gate signal output line 40 and the data line 20 are provided on the gate insulating layer 2 and are arranged in the same layer. The gate signal output line 40 is provided with a rectangular second connection sheet 41 at the end of the gate signal output line 40 located in the transfer region 62. The position of the second connection sheet 41 corresponds to the position of the first connection sheet 11, and the second connection sheet 41 is connected to the first connection sheet 11 through the via hole 8 formed in the gate insulating layer 2, and the first connection sheet 11 and the second connection sheet 41 are called the jumper pad 50 to realize that the gate signal output line 40 and the gate line 10 are connected by the jumper pad 50.

The inventor of the present application has found by research that in the above structure, since the common electrode leading wire 30 and the first connection sheet 11 are arranged in the same layer, and the distance between them is relatively small, usually the distance is about 10 μm, so that an edge of the common electrode leading wire 30 facing the first connection sheet 11 and an edge of the first connection sheet 11 facing the common electrode leading wire 30 are prone to charge concentration, and an ESD prone area is formed between the common electrode leading wire 30 and the first connection sheet 11. In the structure where the gate signal output line 40 is connected to the gate line 10 shown in FIGS. 1 to 3, since a portion of the gate signal output line 40 connected to the jumper pad 50 is disposed to extend parallel to the gate line 10, the gate signal output line 40 overlaps the ESD prone area, that is, the trace of the gate signal output line 40 crosses the ESD prone area. This structure not only increases the probability of ESD in the ESD prone area, but also breaks down the gate insulating layer when ESD occurs in the ESD prone area, that is, it will cause a short circuit between the gate signal output line 40 and the common electrode leading wire 30 and/or between the gate signal output line 40 and the first connection sheet 11.

Figure 4:
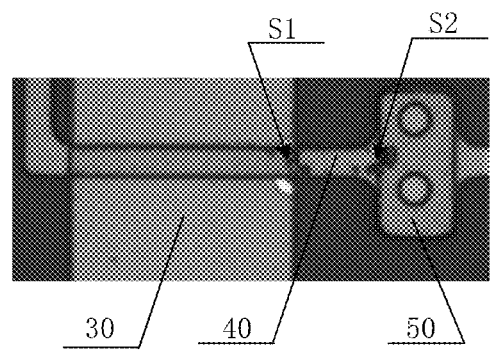
FIG. 4 is a photograph of a short-circuited part of a product in the related art.

FIG. 4 is a photograph of a short-circuited portion of a product in the related art. It can be seen from FIG. 4 that all short circuits occur in the ESD prone area, where the first short circuit point 51 is a short circuit between the gate signal output line 40 and the common electrode leading wire 30, which is located on the edge of the common electrode leading wire 30 facing the jumper pad 50; and the second short-circuit point S2 is a short-circuit between the gate signal output line 40 and the gate line 10, which is located on the edge of the jumper pad 50 facing the common electrode leading wire 30. The two short-circuit points 51 and S2 belong to the charge concentration position.

Referring to FIGS. 5 to 18, an array substrate according to an embodiment of the present disclosure includes: a display region 63 for displaying an image; a non-display region including a transfer region 62 and a circuit region 61, the transfer region 62 being provided between the display region 63 and the circuit region 61; a shift register 7 provided in the non-display region; a gate line 10 provided in the display region 63 and extending in a first direction; and a gate signal output line 40 provided in the non-display region and having a first end and a second end. The first end of the gate signal output line 40 is connected to the shift register 7, and the second end of the gate signal output line 40 is connected to the gate line 10 at a side of the gate line 10 in a second direction perpendicular to the first direction.

According to some embodiments of the present disclosure, the second end of the gate signal output line 40 is connected to the gate line 10 at the side of the gate line 10 in the second direction perpendicular to the first direction, to avoid the gate signal output line 40 from the ESD prone area, which not only reduces the probability of occurrence of the ESD in the ESD prone area, but also avoids short-circuits caused by the ESD prone area, effectively overcoming the problem of short circuit of the gate signal output line in related art, thereby improving the display quality, improving the yield rate and saving production cost.

Referring to FIGS. 5 to 10, according to some embodiments of the present disclosure, the array substrate further includes: a jumper pad 50, the second end of the gate signal output line 40 is connected to the jumper pad 50 at a side of the jumper pad 50 in the second direction, and the gate line 10 is connected to the jumper pad 50 at a side of the jumper pad 50 away from the non-display region in the first direction. For example, a size of the jumper pad 50 in the first direction is smaller than a size of the jumper pad 50 in the second direction.

Referring to FIGS. 5 to 10, in some embodiments of the present disclosure, the array substrate further includes: a common electrode leading wire 30, provided in a same layer as the gate line 10, and extending in a direction crossing the gate line 10; and a gate insulating layer 2 covering the common electrode leading wire 30 and the gate line 10, the gate signal output line 40 being provided on the gate insulating layer 2. For example, the jumper pad 50 is located on the side of the common electrode leading wire 30 facing the gate line 10 in the first direction.

Referring to FIGS. 5 to 10, in some embodiments of the present disclosure, the second end of the gate signal output line 40 is connected to the second connection sheet 41 of the jumper pad 50 at a side of the second connection sheet 41 of the jumper pad 50 in the second direction, and the gate line 10 is connected to the first connection sheet 11 of the jumper pad 50 at a side of the first connection sheet 11 of the jumper pad 50 away from the non-display region in the first direction.

Referring to FIGS. 11 to 18, in some embodiments of the present disclosure, the array substrate further includes: a connection line 12 provided in the non-display region and having a first end and a second end. The first end of the connection line 12 is connected to the gate line 10 at a side of the gate line 10 in the second direction perpendicular to the first direction, and the second end of the connection line 12 is connected to the gate signal output line 40. For example, an angle between the connection line 12 and the gate line 10 is within the range of 45° to 90°.

Referring to FIGS. 11 to 18, in some embodiments of the present disclosure, the second end of the gate signal output line 40 and the second end of the connection line 12 are respectively at opposite first and second sides of the jumper pad 50 in the second direction, and connected to each other through the jumper pad 50.

Referring to FIGS. 11 to 18, in some embodiments of the present disclosure, the array substrate further includes: a common electrode leading wire 30 provided in a same layer as the gate line 10, and extending in a direction crossing the gate line 10; a gate insulating layer 2 covering the common electrode leading wire 30 and the gate line 10, the gate signal output line 40 being provided on the gate insulating layer 2; and a jumper pad 50, including a first connection sheet 11 and a second connection sheet 41. The first connection sheet 11 and the second connection sheet 41 are connected to each other through a via hole 8 formed in the gate insulating layer 2, the second end of the gate signal output line 40 is connected to the second connection sheet 41 at a first side of the jumper pad 50 in the second direction and the second connection sheet 41 is provided in a same layer as the gate signal output line 40, and the second end of the connection line 12 is connected to the first connection sheet 11 at a second side, opposite to the first side, of the jumper pad 50 in the second direction and the first connection sheet 11 is provided in a same layer as the connection line 12 and the gate line 10.

Figure 5:
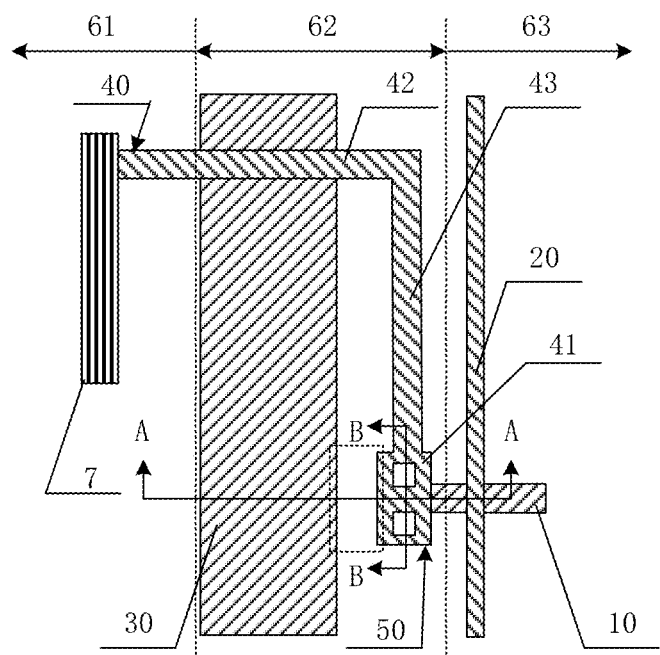
FIG. 5 is a schematic view of a structure where a gate signal output line is connected to a gate line in an array substrate according to an embodiment of the present disclosure.
Figure 6:
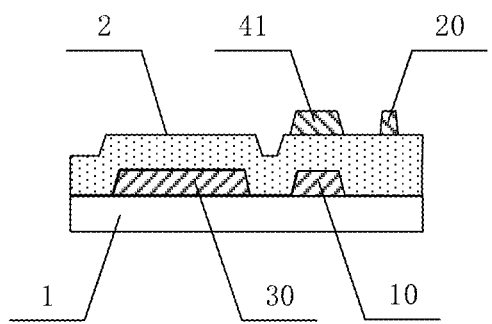
FIG. 6 is a cross-sectional view of the array substrate taken along an A-A direction in FIG. 5.
Figure 7:
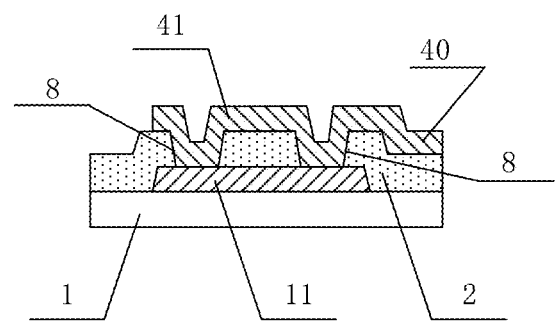
FIG. 7 is a cross-sectional view of the array substrate taken along a B-B direction in FIG. 5.

In order to overcome the short circuit problem of the gate signal output line in the structure in the related art, an embodiment of the present disclosure also provides an array substrate. FIG. 5 is a schematic view of a structure where a gate signal output line is connected to a gate line in an array substrate according to an embodiment of the present disclosure; FIG. 6 is a cross-sectional view of the array substrate taken along an A-A direction in FIG. 5; and FIG. 7 is a cross-sectional view of the array substrate taken along a B-B direction in FIG. 5. For the sake of clarity, illustration of the gate insulating layer 2 is omitted in FIG. 5. As shown in FIGS. 5 to 7, the array substrate according to an embodiment of the present disclosure includes a display region 63 and a non-display region. The non-display region includes a transfer region 62 and a circuit region 61. The transfer region 62 is provided between the display region 63 and the circuit region 61. The display region 63 is provided with gate lines 10 and data lines 20, the gate lines 10 and the data lines 20 of the display region 63 are vertically crossed to form a plurality of pixels arranged in a matrix, and each pixel is provided with a thin film transistor TFT. The circuit region 61 is provided with a shift register 7 and a gate signal output line 40 connected to the shift register 7, and the shift register 7 outputs a turn-on voltage to the thin film transistor TFT through the gate signal output line 40. The transfer region 62 is provided with a common electrode leading wire 30 and a jumper pad 50. The jumper pad 50 is used to connect the gate signal output line 40 and the gate line 10. The common electrode leading wire 30 is perpendicular to or crosses the gate line 10, and is used to output a common voltage to the common electrode in the display region 63, and is located adjacent to the circuit region 61. The gate line 10 and the common electrode leading wire 30 are arranged on the substrate 1, and are arranged in the same layer. The gate line 10 is provided with a rectangular first connection sheet 11 at the end of the gate line 10 located in the transfer region 62. The first connection sheet 11 is located at a position of the transfer region 62 away from the circuit region 61. The gate insulating layer 2 covers the gate line 10, the first connection sheet 11 and the common electrode leading wire 30, and the gate insulating layer 2 is formed with two via holes 8 exposing the first connection sheet 11. The gate signal output line 40 and the data line 20 are provided on the gate insulating layer 2 and are arranged in the same layer. The gate signal output line 40 is provided with a rectangular second connection sheet 41 at the end of the gate signal output line 40 in the transfer region 62, and the position of the second connection sheet 41 corresponds to the position of the first connection sheet 11, and the second connection sheet 41 is connected to the first connection sheet 11 through the two via holes 8 formed in the gate insulating layer 2. The first connection sheet 11 and the second connection sheet 41 are called the jumper pad 50 to realize that the gate signal output line 40 and the gate line 10 are connected by the jumper pad 50. In the present embodiment, the arrangement of the gate line 10 and the common electrode leading wire 30 in the same layer means that they are arranged on the substrate 1, and are simultaneously formed by a single patterning process during the manufacturing process. The fact that the gate signal output line 40 and the data line 20 are arranged in the same layer means that they are provided on the gate insulating layer 2 and are formed simultaneously by a single patterning process during the manufacturing process. The term "vertical", "cross" or "parallel" in this embodiment refers to "vertical", "cross" or "parallel" in the plane where the display region 63 and the non-display region are located.

Referring to FIGS. 5 to 7, in embodiments of the present disclosure, the portion of the gate signal output line 40 connecting to the jumper pad 50 is provided to extend in the direction making an angle of 45°-90° with the gate line 10, in order to avoid the overlap between the gate signal output line 40 and the ESD prone area. Specifically, in embodiments of the present disclosure, in the transfer region 62, the gate signal output line 40 includes a lead-out section 42 and a transfer section 43, and each of the lead-out section 42 and the transfer section 43 includes a first end and a second end, and the lead-out section 42 is parallel to the gate line 10, and is perpendicular to or crosses the common electrode leading wire 30, and the transfer section 43 and the gate line 10 form an angle of 45° to 90° with each other. The first end of the lead-out section 42 is connected to the shift register 7 located in the circuit region 61, the second end of the lead-out section 42 is connected to the first end of the transfer section 43, the first end of the transfer section 43 is connected to the second end of the lead-out section 42, and the second end of the transfer section 43 is connected to the second connection sheet 41. In some embodiments of the present disclosure, the transfer section 43 is perpendicular to or crosses the gate line 10 and parallel to the common electrode leading wire 30. In this way, in the embodiments of the present disclosure, the extension direction of the portion of the gate signal output line 40 connecting to the jumper pad 50 is adjusted, so that the fact that the portion of the gate signal output line 40 connecting to the jumper pad 50 in the related art is parallel to the gate line 10 is changed to the fact that the portion of the gate signal output line 40 connecting to the jumper pad 50 makes an angle of 45° to 90° with the gate line 10. As a result, the gate signal output line 40 avoids the ESD prone area (the area indicated by the dashed rectangular box in FIG. 5), which effectively avoids short circuit caused by ESD in the ESD prone area.

In the array substrate provided in the embodiments of the present disclosure, by setting the portion of the gate signal output line 40 connecting to the jumper pad 50 to make an angle of 45° to 90° with the gate line, the gate signal output line avoids the ESD prone area, which reduces a probability of ESD occurred in the ESD prone area, and the short circuit caused by the ESD prone area is avoided, which effectively overcomes the problem of the short circuit of the gate signal output line in the related art, thereby improving the display quality, improving the yield rate, and saving the production cost.

The technical solutions of the embodiments of the present disclosure are further described below through the manufacturing process of the array substrate. The "patterning process" in the embodiments of the present disclosure includes forming a thin film, coating a photoresist on the thin film, exposing the photoresist using a mask, developing the photoresist, and etching the thin film using the pattern of the developed photoresist, and stripping photoresists, which are mature manufacturing processes in related art. The thin film can be formed by known processes such as sputtering, evaporation, chemical vapor deposition, etc., known coating process can be used for coating, and known method can be used for etching, which is not particularly limited herein. In the description of this embodiment, it should be understood that "thin film" refers to a layer of thin film produced by depositing or the like a certain material on a substrate. If the "thin film" does not need to be subjected to a patterning process during the entire manufacturing process, the "thin film" may also be called a "layer". If the "thin film" still needs to be subjected to a patterning process during the entire manufacturing process, it is called a "thin film" before the patterning process is implemented and a "layer" after the patterning process has been implemented. The pattern is included in the "layer" after the patterning process has been implemented.

Figure 8:
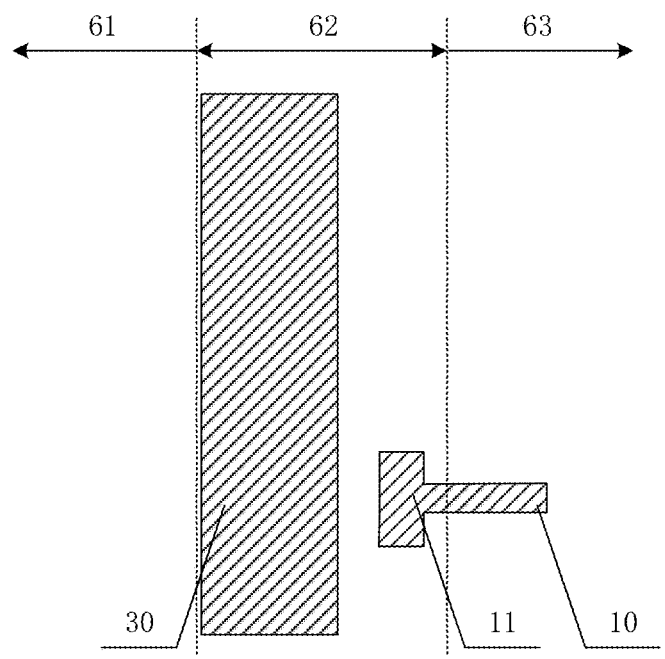
FIG. 8 is a schematic view after forming patterns of a gate line, a first connection sheet and a common electrode leading wire of the array substrate according to an embodiment of the present disclosure.
Figure 9:
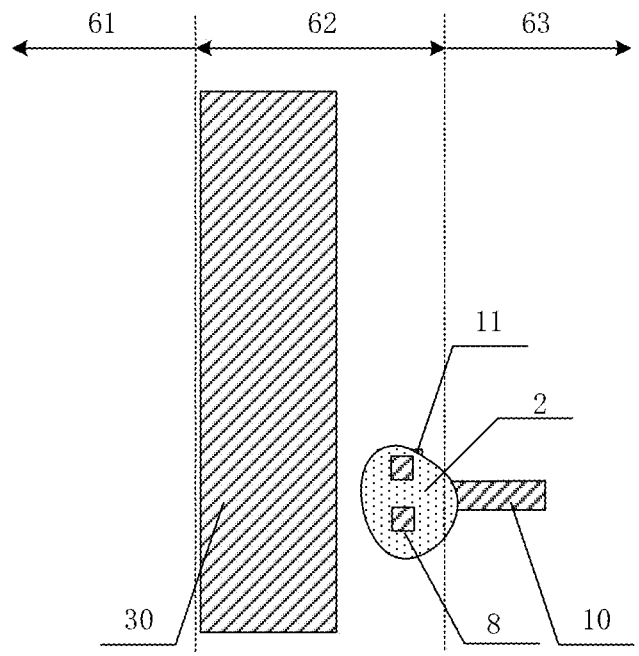
FIG. 9 is a schematic view after forming a pattern of a gate insulating layer, formed with via holes, of the array substrate according to an embodiment of the present disclosure.

FIG. 8 is a schematic view of the array substrate after forming patterns of a gate line 10, a first connection sheet 11 and a common electrode leading wire 30 of the array substrate according to an embodiment of the present disclosure; and FIG. 9 is a schematic view of the array substrate after forming a pattern of a gate insulating layer 2 of the array substrate formed with via holes 8. For the sake of clarity, only a part of the gate insulating layer 2 is shown in FIG. 9, and the part of the gate insulating layer 2 covers a part of the first connection sheet 11 and a part of the gate line 10.

In the first patterning process, referring to FIGS. 6, 7 and 8, a pattern of a gate line 10, a pattern of a first connection sheet 11 and a pattern of a common electrode leading wire 30 are formed on the substrate 1. Forming the pattern of the gate line 10, the pattern of the first connection sheet 11 and the pattern of the common electrode leading wire 30 on the substrate 1 includes: depositing a first metal film on the substrate 1, coating a layer of photoresist on the first metal film, exposing the photoresist by using a single-tone mask and developing the photoresist. An area of the photoresist corresponding to the gate line 10, the first connection sheet 11 and the common electrode leading wire 30 is remained as an unexposed area, and the other area of the photoresist is removed as a fully exposed area. The portion of the first metal film corresponding to the fully exposed area is etched through an etching process. After the portion of the first metal film corresponding to the fully exposed area is etched away, the remaining photoresist is stripped off. The pattern of the gate line 10, the pattern of the first connection sheet 11 and the pattern of the common electrode leading wire 30 are formed on the substrate 1, as shown in FIG. 8. The gate line 10 is formed in the display region 63, the first connection sheet 11 and the common electrode leading wire 30 are formed in the transfer region 62, the common electrode leading wire 30 is perpendicular to or crosses the gate line 10, the first connection sheet 11 is rectangular in shape, and the gate line 10 and the first connection sheet 11 are in an integrated structure.

The inventor of the present application has found by further research that the probability of occurrence of ESD in the ESD prone area is related to the distance between the common electrode leading wire 30 and the first connection sheet 11, and the facing width or overlap width between the first connection sheet 11 and the common electrode leading wire 30. For this reason, the embodiments of the present disclosure propose to reduce the risk of occurrence of ESD by increasing the distance between the common electrode leading wire 30 and the first connection sheet 11 and/or increasing the facing width or overlap width between the common electrode leading wire 30 and the first connection sheet 11. In the first patterning process, in a direction perpendicular to the common electrode leading wire 30, the distance between an edge of the first connection sheet 11 facing the common electrode leading wire 30 and an edge of the common electrode leading wire 30 facing the first connection sheet 11 is set to be greater than 12 μm, and the facing width or overlap width between the first connection sheet 11 and the common electrode leading wire 30 is set to be greater than 20 μm. In some examples of the present disclosure, the distance between the edge of the common electrode leading wire 30 facing the first connection sheet 11 and the edge of the first connection sheet 11 facing the common electrode leading wire 30 is set to be in the range from 15 μm to 18 μm, and the facing width or overlap width between the first connection sheet 11 and the common electrode leading wire 30 is set to be in the range of from 22 μm to 25 μm.

In the second patterning process, referring to FIGS. 6, 7, and 9, a pattern of the gate insulating layer 2 formed with via holes 8 is formed. Forming the pattern of the gate insulating layer 2 formed with the via holes 8 includes: depositing a gate insulating film on the substrate 1 on which the pattern of the gate line 10, the pattern of the first connection sheet 11 and the pattern of the common electrode leading wire 30 are formed, and coating a layer of photoresist on the gate insulating film, exposing the photoresist by using a single-tone mask and developing the photoresist. An area of the photoresist corresponding to the via holes 8 is removed as a fully exposed area, and other area of the photoresist is remained as an unexposed area. The portion of the gate insulating thin film corresponding to the fully exposed area is etched through an etching process. After the portion of the gate insulating thin film corresponding to the fully exposed area is etched away, the remaining photoresist is stripped off. The pattern of the gate insulating layer 2 formed with the via holes 8 is formed on the substrate 1, as shown in FIGS. 6, 7 and 9. The two via holes 8 are located at the position where the first connection sheet 11 is located, and the portion of the gate insulating film in the two via holes 8 is etched away, exposing a part of the surface of the first connection sheet 11.

Figure 10:
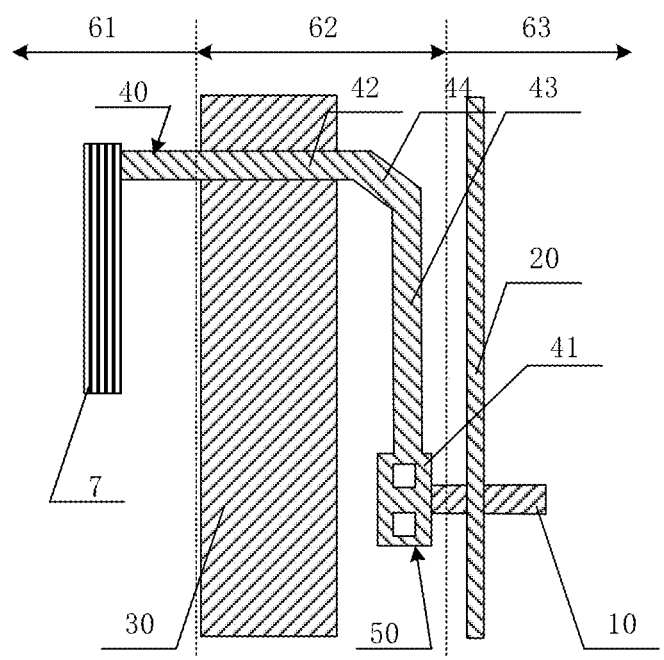
FIG. 10 is a schematic view of another structure where the gate signal output line is connected to the gate line in the array substrate according to an embodiment of the present disclosure.

In the third patterning process, referring to FIGS. 6, 7 and 10, a pattern of the gate signal output line 40, a pattern of the second connection sheet 41 and a pattern of the data line 20 are formed. Forming the pattern of the gate signal output line 40, the pattern of the second connection sheet 41 and the pattern of the data line 20 includes: depositing a second metal film on the substrate 1 formed with the pattern of the gate line 10, the pattern of the first connection sheet 11, the pattern of the common electrode leading wire 30, and the pattern of the gate insulating layer 2, coating a layer of photoresist on the second metal film, exposing the photoresist by using a single-tone mask and developing the photoresist. An area of the photoresist corresponding to the gate signal output line 40, the second connection sheet 41 and the data line 20 is remained as an unexposed area, and the other area of the photoresist is removed as a fully exposed area. The part of the second metal film corresponding to the fully exposed area is etched through an etching process. After the part of the second metal film corresponding to the fully exposed area is etched away, the remaining photoresist is stripped off. The pattern of the gate signal, the pattern of the gate signal output line 40, the pattern of the second connection sheet 41 and the pattern of the data line 20 are formed on the substrate 1, as shown in FIGS. 5-7, and 10. The data line 20 is formed in the display region 63, the second connection sheet 41 is formed in the transfer region 62, the gate signal output line 40 is formed in the transfer region 62 and the circuit region 61, and the second connection sheet 41 is connected to the first connection sheet 11 through the two via holes 8. The gate signal output line 40 includes the lead-out section 42 and the transfer section 43 connected to each other, the lead-out section 42 is perpendicular to or crosses the common electrode leading wire 30, the transfer section 43 is parallel to the common electrode leading wire 30, the transfer section 43 connected to the second connection sheet 41 is parallel to the common electrode leading wire 30 and perpendicular to the gate line 10. The lead-out section 42, the transfer section 43, and the second connection sheet 41 are in an integral structure.

In order to keep the gate signal output line 40 as far away from the ESD prone area as possible so as to further reduce the probability of occurrence of short circuit of the gate signal output line 40, in the third patterning process, the length of the transfer section 43 of the gate signal output line 40 is set to be greater than 18 μm, that is, in a direction parallel to the common electrode leading wire 30, the distance between an edge of the lead-out section 42 of the gate signal output line 40 facing the second connection sheet 41 and an edge of the second connection sheet 41 facing the lead-out section 42 is greater than 18 μm. In some examples of the present disclosure, the distance between the edge of the lead-out section 42 of the gate signal output line 40 facing the second connection sheet 41 and the edge of the second connection sheet 41 facing the lead-out section 42 is set to be in the range of 22 μm~25 μm. Therefore, even if ESD occurs in the ESD prone area, it is possible to ensure that no short circuit of the gate signal output line 40 occurs.

It can be seen from the foregoing manufacturing process of the array substrate that the process flow for manufacturing the array substrate according to the embodiments of the present disclosure is the same as the manufacturing process flow in the related art. Therefore, the implementation of the embodiments of the present disclosure does not need to change the process flow in the related art. There is no need to change the process equipment in the related art, the process compatibility is good, the practicability is strong, and it has good application prospects.

It should be noted that, in this embodiment, only two via holes 8 are formed as an example for description. In actual implementation, only one via hole 8 may be provided according to connection requirements. Shapes and positions of the first connection sheet 11 and the second connection sheet 41 can also be adjusted accordingly according to actual needs. In addition, although the foregoing manufacturing process is described by taking a case where the transfer section 43 is perpendicular to the gate line 10 as an example, the manufacturing process is also applicable to a case that a certain acute angle is formed between the transfer section 43 and the gate line 10. The foregoing process only illustrates the structure related to the connection of the gate signal output line 40 and the gate line 10. In actual implementation, in the patterning process of forming the gate line 10, patterns such as the gate electrode of the thin film transistor are simultaneously formed, and in the patterning process of forming the data line, the patterns such as the source electrode and the drain electrode of the thin film transistor are also formed at the same time. The manufacturing process of the array substrate also includes the processes such as forming the active layer, forming the passivation layer, and forming the pixel electrode. The above structure and its manufacturing process are the same as those in the related art and will not be repeated herein.

FIG. 10 is a schematic view of another structure where the gate signal output line 40 is connected to the gate line 10 in the array substrate according to an embodiment of the present disclosure. For the sake of clarity, illustration of the gate insulating layer 2 is omitted in FIG. 10. The connection structure of the gate signal output line 40 and the gate line 10 of the array substrate in this embodiment is different from the structure shown in FIG. 5 in that, the gate signal output line 40 includes a lead-out section 42, an intermediate section 44 and a transfer section 43. The lead-out section 42 is perpendicular to or crosses the common electrode leading wire 30 and parallel to the gate line 10, and the lead-out section 42 has a first end which is connected to the shift register 7 located in the circuit region 61, and a second end which is connected to the first end of the intermediate section 44. The transfer section 43 is parallel to the common electrode leading wire 30 and is perpendicular to or crosses the gate line 10, and the transfer section 43 has a first end which is connected to the second end of the intermediate section 44 and a second end which is connected to the second connection sheet 41. The intermediate section 44 is provided between the lead-out section 42 and the transfer section 43, the first end of the intermediate section 44 is connected to the second end of the lead-out section 42, and the second end of the intermediate section 44 is connected to the first end of the transfer section 43, and an angle between the intermediate section 44 and the transfer section 43 is within the range of 30° to 60°. In actual implementation, the intermediate section 44 may have a straight-line shape or an arc shape. The structure shown in FIG. 10 not only realizes the fact that the portion of the gate signal output line 40 connecting to the jumper pad 50 is parallel to the gate line 10 in the related art is changed to the fact that the portion of the gate signal output line 40 connecting to the jumper pad 50 is perpendicular to the gate line 10. As a result, the gate signal output line 40 avoids the ESD prone area, which effectively avoids short circuit caused by occurrence of ESD in the ESD prone area, and provision of the inclined intermediate section 44 prevents the charge concentration that may occur at the right-angle corner of the gate signal output line 40 and the ESD caused by the charge concentration, which further ensures the display quality and the yield rate.

Figure 11:
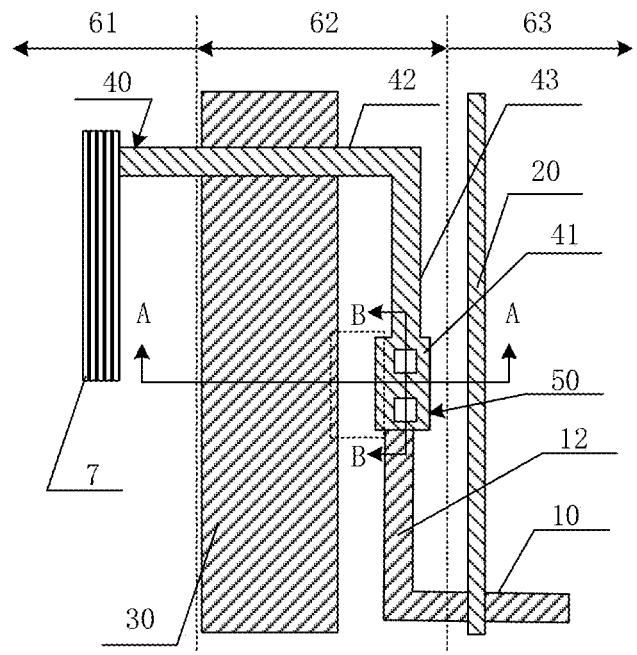
FIG. 11 is a schematic view of a structure where a gate signal output line is connected to a gate line in an array substrate according to another embodiment of the present disclosure.
Figure 12:
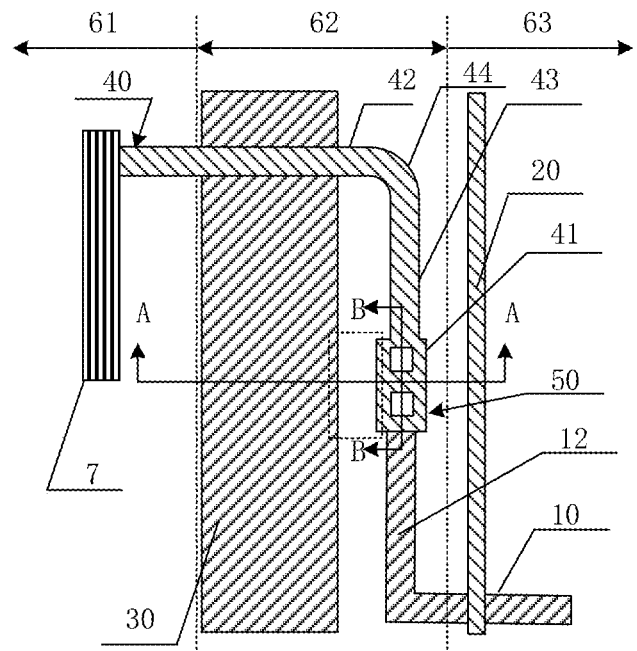
FIG. 12 is a schematic view of a structure where a gate signal output line is connected to a gate line in an array substrate according to yet another embodiment of the present disclosure.
Figure 13:
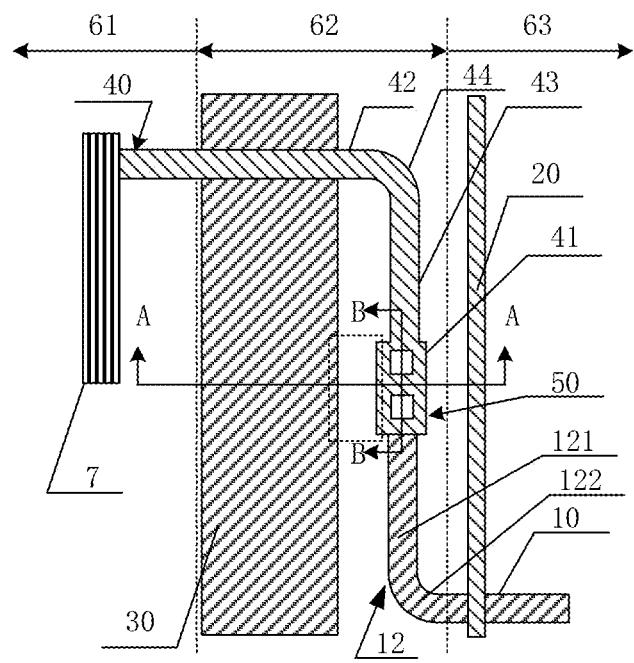
FIG. 13 is a schematic view of a structure where a gate signal output line is connected to a gate line in an array substrate according to still another embodiment of the present disclosure.
Figure 14:
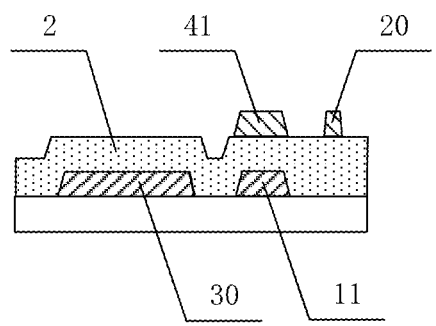
FIG. 14 is a cross-sectional view of the array substrate taken along an A-A direction of FIGS. 11, 12 and 13.
Figure 15:
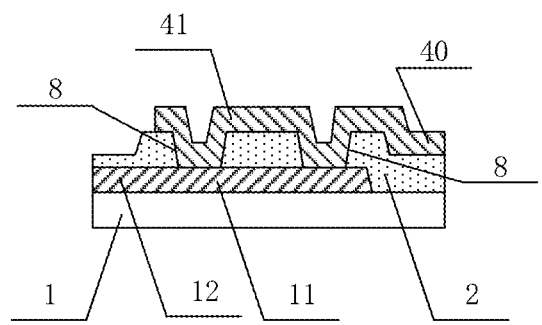
FIG. 15 is a cross-sectional view of the array substrate taken along a B-B direction in FIGS. 11, 12, and 13.

FIG. 11 is a schematic view of a structure where a gate signal output line 40 is connected to a gate line 10 in an array substrate according to another embodiment of the present disclosure; FIG. 12 is a schematic view of a structure where a gate signal output line 40 is connected to a gate line 10 in an array substrate according to yet another embodiment of the present disclosure; FIG. 13 is a schematic view of a structure where a gate signal output line 40 is connected to a gate line 10 in an array substrate according to still another embodiment of the present disclosure; FIG. 14 is a cross-sectional view of the array substrate taken along an A-A direction of FIGS. 11, 12 and 13; and FIG. 15 is a cross-sectional view of the array substrate taken along a B-B direction in FIGS. 11, 12, and 13. For the sake of clarity, illustration of the gate insulating layer 2 is omitted in FIGS. 11, 12 and 13. The connection structure of the gate signal output line 40 and the gate line 10 of the array substrate in this embodiment is different from the structure shown in FIGS. 5 and 10 in that, a connection line 12 is provided, and the gate line 10 is connected to the gate signal output line 40 through the connection line 12. The connection line 12 is located in the transfer region 62, and the connection line 12 is parallel to the common electrode leading wire 30 and is perpendicular to or crosses the gate line 10. In addition, the connection line 12 and the data line 20 are substantially parallel to each other, to keep the spacing consistent and avoid short circuits and ESD. The first end of the connection line 12 is connected to the gate line 10, and the second end of the connection line 12 is connected to the gate signal output line 40. For example, the second end of the connection line 12 is connected to the gate signal output line 40 via the jumper pad 50. The second end of the connection line 12 is connected to the first connection sheet 11 of the jumper pad 50. In addition, the transfer section 43 is perpendicular to or crosses the gate line 10 and is substantially parallel to the common electrode leading wire 30. In actual implementation, the connection line 12 may have a straight-line shape or an arc shape. Although in the embodiments shown in FIGS. 11 to 13 the connection line 12 is substantially parallel to the data line 20, parallel to the common electrode leading wire 30 and perpendicular to the gate line 10, the connection line 12 and the gate line 10 may form an angle of 45° to 90° with each other.

In the embodiments shown in FIGS. 12 and 13, the gate signal output line 40 includes a lead-out section 42, an intermediate section 44 and a transfer section 43. The lead-out section 42 is perpendicular to or crosses the common electrode leading wire 30 and is parallel to the gate line 10, and the lead-out section 42 has a first end which is connected to the shift register 7 located in the circuit region 61, and a second end which is connected to the first end of intermediate section 44. The transfer section 43 is parallel to the common electrode leading wire 30 and is perpendicular to or crosses the gate line 10, and the transfer section 43 has a first end which is connected to the second end of the intermediate section 44, and a second end which is connected to the second connection sheet 41. The intermediate section 44 is provided between the lead-out section 42 and the transfer section 43, and the first end of the intermediate section 44 is connected to the second end of the lead-out section 42, and the second end of the intermediate section 44 is connected to the first end of the transfer section 43, and the intermediate section 44 has an arc shape.

In the embodiment shown in FIG. 13, the connection line 12 includes a first connection line portion 121 and a second connection line portion 122, the first connection line portion 121 is substantially parallel to the data line 20 and is substantially parallel to the common electrode leading wire 30 and is perpendicular to or crosses the gate line 10. The first end of the second connection line portion 122 of the connection line 12 is connected to the gate line 10, the second end of the second connection line portion 122 of the connection line 12 is connected to the first end of the first connection line portion 121 of the connection line 12, and the second end of the first connection line portion 121 of the connection line 12 is connected to the first connection sheet 11 of the jumper pad 50. In addition, the second connection line portion 122 of the connection line 12 has an arc shape, and connects the first connection line portion 121 of the connection line 12 to the gate line 10. In addition, the second connection line portion 122 of the connection line 12 may also have a straight-line shape, and the angle between the second connection line portion 122 and the first connection line portion 121 is within the range of 30° to 60°.

The structure shown in FIGS. 11 to 15 not only realizes the fact that the portion of the gate signal output line 40 connecting to the jumper pad 50 is parallel to the gate line 10 in the related art is changed to the fact that the portion of the gate signal output line 40 connecting to the jumper pad 50 is perpendicular to the gate line 10. As a result, the gate signal output line 40 avoids the ESD prone area, which effectively avoids short circuit caused by ESD in ESD prone area. Moreover, by disposing the connection line 12 parallel to the common electrode leading wire 30, the charge concentration that may occur between the jumper pad 50 and the common electrode leading wire 30 due to the gate line 10 being directly connected to the jumper pad 50 and perpendicular to the common electrode leading wire 30, as well as ESD due to charge concentration, are avoided, which further ensures the display quality and the yield rate. In addition, the transfer section 43 is substantially parallel to the common electrode leading wire 30, and the connection line 12 is substantially parallel to the data line 20, which keeps the spacing consistent and avoids short circuits and ESD.

Figure 16:
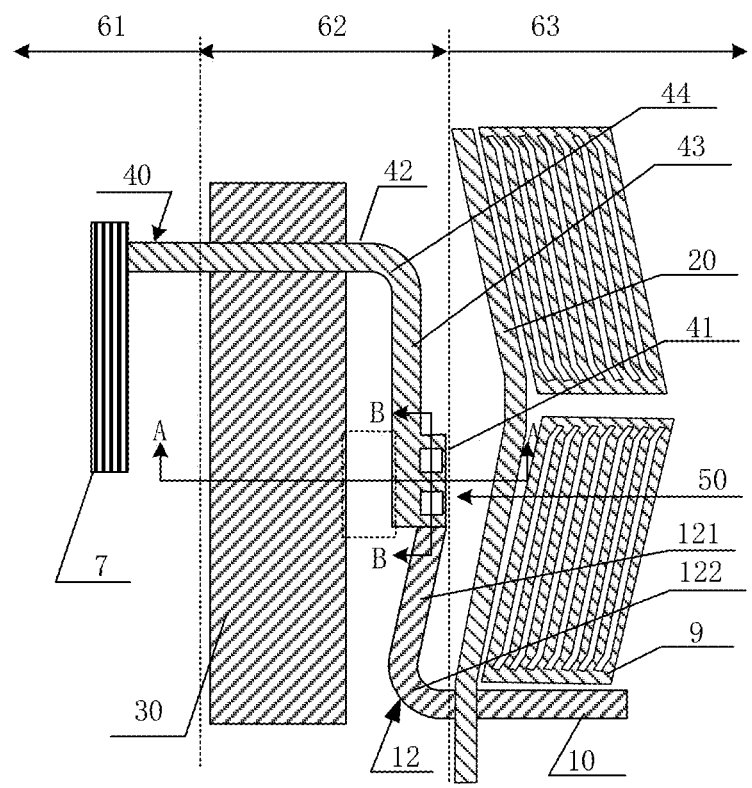
FIG. 16 is a schematic view of a structure where a gate signal output line is connected to a gate line in an array substrate according to a further embodiment of the present disclosure.
Figure 17:
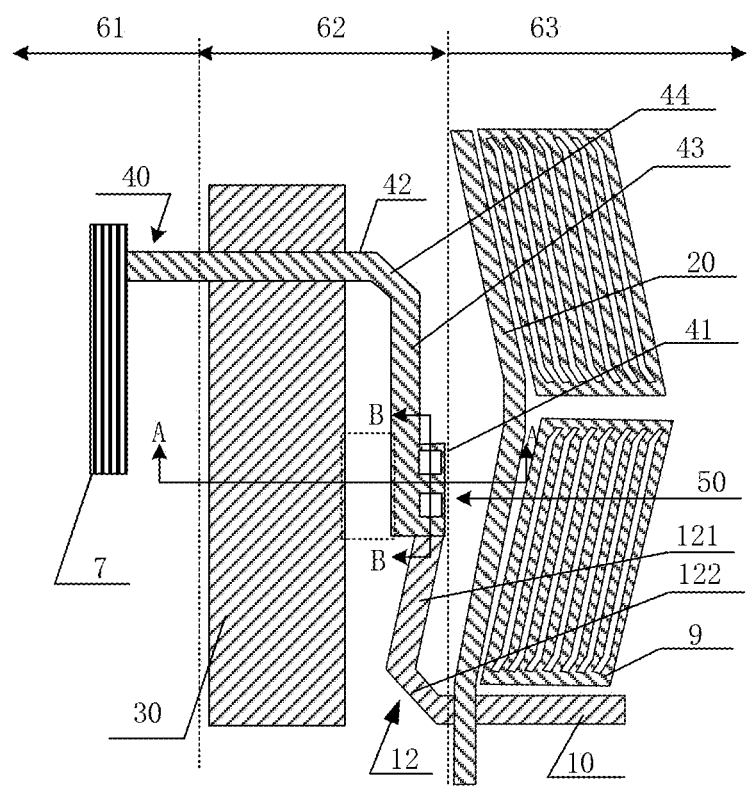
FIG. 17 is a schematic view of a structure where a gate signal output line is connected to a gate line in an array substrate according to a yet further embodiment of the present disclosure.
Figure 18:
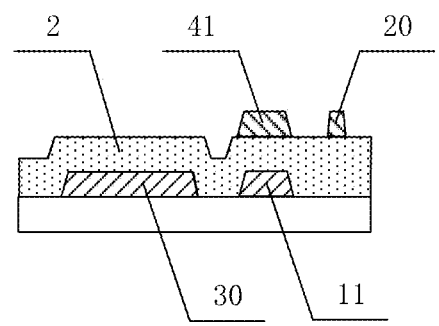
FIG. 18 is a cross-sectional view of the array substrate taken along an A-A direction of FIGS. 16 and 17.
Figure 19:
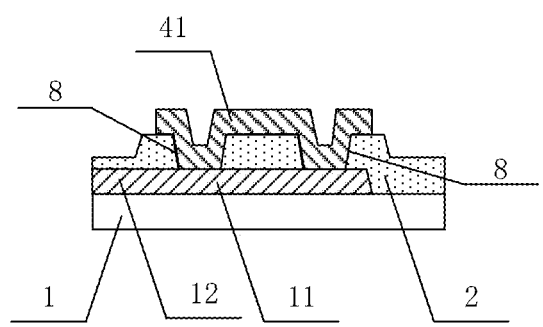
FIG. 19 is a cross-sectional view of the array substrate taken along a B-B direction in FIGS. 16 and 17.

FIG. 16 is a schematic view of a structure where a gate signal output line 40 is connected to a gate line 10 in an array substrate according to a further embodiment of the present disclosure; FIG. 17 is a schematic view of a structure where a gate signal output line 40 is connected to a gate line 10 in an array substrate according to a yet further embodiment of the present disclosure; FIG. 18 is a cross-sectional view of the array substrate taken along an A-A direction of FIGS. 16 and 17; and FIG. 19 is a cross-sectional view of the array substrate taken along a B-B direction in FIGS. 16 and 17. For the sake of clarity, illustration of the gate insulating layer 2 is omitted in FIGS. 16 and 17.

As shown in FIGS. 16 to 19, an array substrate according to an embodiment of the present disclosure includes a display region 63 and a non-display region. The non-display region includes a transfer region 62 and a circuit region 61. The transfer region 62 is between the display region 63 and the circuit region 61. The display region 63 is provided with gate lines 10 and data lines 20, the gate lines 10 and the data lines 20 of the display region 63 cross to form a plurality of pixels arranged in a matrix, and each pixel is provided therein with a thin film transistor TFT. The array substrate also includes a pixel electrode 5 and a common electrode. Each pixel electrode 5 has a substantially parallelogram shape, and includes four borders which as a whole have parallelogram shape, and strip-shaped electrode portions connected between two opposing first borders of the four borders. The strip-shaped electrode portions and two opposing second borders of the four borders are substantially parallel to the corresponding parts of the data line 20. Each of the strip-shaped electrode portions has two ends, and an intermediate portion between the two ends. The intermediate portion is substantially parallel to the second border. The data line 20 has a substantially wavy shape, and each column of pixel electrodes 5 is arranged along the wavy curve. The circuit region 61 is provided with a shift register 7 and a gate signal output line 40 connected to the shift register 7, and the shift register 7 outputs a turn-on voltage to the gate of the thin film transistor TFT through the gate signal output line 40. The source electrode of the thin film transistor TFT is connected to the source driving circuit provided in the circuit region 61 through the data line 20, and the drain electrode of the thin film transistor TFT is connected to the pixel electrode 5. The transfer region 62 is provided with a common electrode leading wire 30 and a jumper pad 50. The jumper pad 50 is used to connect the gate signal output line 40 and the gate line 10. The common electrode leading wire 30 is perpendicular to or crosses the gate line 10, and is used to output a common voltage to the common electrode in the display region 63, and is located adjacent to the circuit region 61. The gate line 10 and the common electrode leading wire 30 are provided on the substrate 1, and are provided in the same layer.

As shown in FIGS. 16 to 19, the array substrate according to an embodiment of the present disclosure further includes a connection line 12, and the gate line 10 is connected to the gate signal output line 40 through the connection line 12. The connection line 12 is located in the transfer region 62, and the connection line 12 is substantially parallel to the corresponding portion of the data line 10 and crosses the gate line 10. The connection line 12 is substantially parallel to the corresponding portion of the data line 20 to keep the spacing consistent and avoid short circuits and ESD. The first end of the connection line 12 is connected to the gate line 10, and the second end of the connection line 12 is connected to the gate signal output line 40. For example, the second end of the connection line 12 is connected to the gate signal output line 40 via the jumper pad 50. The second end of the connection line 12 is connected to the first connection sheet 11 of the jumper pad 50. In addition, the transfer section 43 is perpendicular to or crosses the gate line 10 and is substantially parallel to the common electrode leading wire 30.

As shown in FIGS. 16 to 19, in some embodiments of the present disclosure, the connection line 12 includes a first connection line portion 121 and a second connection line portion 122, the first connection line portion 121 is substantially parallel to the corresponding portion of the data line 20 and crosses the gate line 10. The first end of the second connection line portion 122 of the connection line 12 is connected to the gate line 10, the second end of the second connection line portion 122 of the connection line 12 is connected to the first end of the first connection line portion 121 of the connection line 12, and the second end of the first connection line portion 121 of the connection line 12 is connected to the first connection sheet 11 of the jumper pad 50. Specifically, the second connection line portion 122 of the connection line 12 is parallel to a portion of the data line 12, and the portion of the data line 12 is opposite to the second connection line portion 122 in the first direction and is located in the same range as the second connection line portion 122 in the second direction. In addition, as shown in FIG. 16, the second connection line portion 122 of the connection line 12 has an arc shape, and connects the first connection line portion 121 of the connection line 12 to the gate line 10. In addition, as shown in FIG. 17, the second connection line portion 122 of the connection line 12 may also have a straight-line shape, and the angle between the second connection line portion 122 and the first connection line portion 121 is in the range of 30° to 60°. The first connection line portion 121 of the connection line 12 and the gate line 10 may form an angle of 45° to 90° with each other.

As shown in FIGS. 16 to 19, in some embodiments of the present disclosure, the first connection sheet 11 has a rectangular shape, and the first connection sheet 11 is located at a position of the transfer region 62 away from the circuit region 61. The gate insulating layer 2 covers the gate line 10, the first connection sheet 11 and the common electrode leading wire 30, and the gate insulating layer 2 is formed with two via holes 8 exposing the first connection sheet 11. The gate signal output line 40, the data line 20, and the pixel electrode 9 are provided on the gate insulating layer 2, and are provided in the same layer.

As shown in FIGS. 16 to 19, in some embodiments of the present disclosure, the portion of the gate signal output line 40 connecting to the jumper pad 50 is disposed to extend in the direction making an angle of 45° to 90° with the gate line 10, in order to avoid the overlap of the gate signal output line 40 and the ESD prone area. Specifically, in the embodiment of the present disclosure, in the transfer region 62, the gate signal output line 40 includes a lead-out section 42 and a transfer section 43, and each of the lead-out section 42 and the transfer section 43 includes a first end and a second end, the lead-out section 42 is parallel to the gate line 10, and is perpendicular to or crosses the common electrode leading wire 30, the transfer section 43 and the gate line 10 form an angle of 45° to 90° with each other, the first end of the lead-out section 42 is connected to the shift register 7 in the circuit region 61, the second end of the lead-out section 42 is connected to first end of transfer section 43, the first end of the transfer section 43 is connected to the second end of the lead-out section 42, the second end of the transfer section 43 is connected to the second connection sheet 41. In some embodiments of the present disclosure, the transfer section 43 is perpendicular to or crosses the gate line 10 and is parallel to the common electrode leading wire 30. In this way, in the embodiment of the present disclosure, the extension direction of the portion of the gate signal output line 40 connecting to the jumper pad 50 is adjusted, and the fact that the portion of the gate signal output line 40 connecting to the jumper pad 50 is parallel to the gate line 10 in the related art is changed to the fact that the portion of the gate signal output line 40 connecting to the jumper pad 50 makes an angle of 45° to 90° with the gate line 10. As a result, the gate signal output line 40 avoids the ESD prone area (the area of the dashed rectangular box in FIG. 16), which effectively avoids short circuit caused by ESD in the ESD prone area.

As shown in FIGS. 16 to 19, in some embodiments of the present disclosure, the gate signal output line 40 further includes an intermediate section 44. The first end of the lead-out section 42 is connected to the shift register 7 located in the circuit region 61, and the second end of the lead-out section 42 is connected to the first end of the intermediate section 44. The first end of the transfer section 43 is connected to the second end of the intermediate section 44, and the second end of the transfer section 43 is connected to the second connection sheet 41. The intermediate section 44 is provided between the lead-out section 42 and the transfer section 43, the first end of the intermediate section 44 is connected to the second end of the lead-out section 42 and the second end of the intermediate section 44 is connected to the first end of the transfer section 43. As shown in FIG. 16, the intermediate section 44 has an arc shape. As shown in FIG. 17, the intermediate section 44 may have a straight-line shape. The angle between intermediate section 44 and transfer section 43 is in the range of 30° to 60°.

As shown in FIGS. 16 to 19, in some embodiments of the present disclosure, the position of the second connection sheet 41 corresponds to the position of the first connection sheet 11, the second connection sheet 41 has a rectangular shape, and the second connection sheet 41 is connected to the first connection sheet 11 through the two via holes 8 formed in the gate insulating layer 2. The first connection sheet 11 and the second connection sheet 41 are called as the jumper pad 50 to realize that the gate signal output line 40 and the gate line 10 are connected by the jumper pad 50. In the present embodiment, arrangement of the gate line 10 and the common electrode leading wire 30 in the same layer means that they are arranged on the substrate 1, and are simultaneously formed by a single patterning process during the manufacturing process. The fact that the gate signal output line 40, the data line 20 and the pixel electrode 9 are arranged in the same layer means that all of them are provided on the gate insulating layer 2 and are formed simultaneously by a single patterning process during the manufacturing process. The term "vertical", "cross" or "parallel" in this embodiment refers to "vertical", "cross" or "parallel" in the plane where the display region 63 and the non-display region are located.

The structure shown in FIGS. 16 to 19 not only realizes that the fact that the portion of the gate signal output line 40 connecting to the jumper pad 50 is parallel to the gate line 10 in the related art is changed to the fact that the portion of the gate signal output line 40 connecting to the jumper pad 50 is perpendicular to the gate line 10. As a result, the gate signal output line 40 avoids the ESD prone area, which effectively avoids short circuit caused by ESD in the ESD prone area. And, provision of the arc-shaped or inclined intermediate section 44 prevents the charge concentration that may occur at the right-angle corner of the gate signal output line 40 and the ESD caused by the charge concentration, which further ensures the display quality and the yield rate. In addition, the arc-shaped second connection line portion 122 of the connection line 12 avoids the charge concentration that may occur at the right-angle corner of the connection between the connection line 12 and the gate line 10 and the ESD caused by the charge concentration, which further ensures the display quality and the yield rate. In addition, the transfer section 43 is substantially parallel to the common electrode leading wire 30, and the connection line 12 is substantially parallel to the corresponding portion of the data line 20 to keep the spacing consistent and avoid short circuits and ESD.

An embodiment of the present disclosure also provides a display panel, including the aforementioned array substrate. The display panel can be applied to any products or components with display function, such as mobile phones, tablet computers, televisions, displayer, notebook computers, digital photo frames, and navigators.

An embodiment of the present disclosure also provides a display apparatus, including the aforementioned display panel. The display apparatus can be any products or components with a display function, such as mobile phones, tablet computers, televisions, displayers, notebook computers, digital photo frames, and navigators.

In the array substrate, the display panel, and the display apparatus provided in the embodiments of the present disclosure, by disposing the portion of the gate signal output line 40 connecting to the jumper pad 50 to make an angle of 45° to 90° with the gate line, the gate signal output line 40 avoids the ESD prone area, which reduces a probability of occurrence of ESD in the ESD prone area, and the short circuit caused by the ESD prone area is avoided, and which effectively overcomes the problem of the short circuit of the gate signal output line in the related art, thereby improving the display quality, improving the yield rate, and saving the production cost.

Although in FIG. 5, FIG. 10, and FIGS. 11 to 13, the data line 20 is shown as a data line 20 having a straight-line shape, the data line 20 may have any suitable shape and it shape is not limited to a straight-line shape.

Although some exemplary embodiments of the present disclosure have been described and illustrated above, those skilled in the art will understand that changes can be made to these exemplary embodiments without departing from the principles and spirit of the present disclosure, and the scope of the present disclosure is defined by the claims and their equivalents.

What is claimed is:

1. An array substrate, comprising:
    a display region for displaying an image;
    a non-display region;
    a shift register provided in the non-display region;
    a gate line provided in the display region and extending along a first direction;
    a gate signal output line, provided in the non-display region and having a first end and a second end, the first end of the gate signal output line being connected to the shift register, and the second end of the gate signal output line being connected to the gate line at a side of the gate line in a second direction perpendicular to the first direction;
    a common electrode leading wire, provided in a same layer as the gate line, and extending in a direction crossing the gate line;
    a gate insulating layer covering the common electrode leading wire and the gate line, the gate signal output line being provided on the gate insulating layer; and
    a jumper pad, comprising a first connection sheet and a second connection sheet, wherein
        the first connection sheet extends along the second direction, and the second connection sheet extends along the second direction;
        the first connection sheet and the second connection sheet are respectively arranged on opposite sides of the gate insulating layer;
        the first connection sheet is connected to and provided in a same layer as the gate line, and the second connection sheet is connected to and provided in a same layer as the gate signal output line, and the first connection sheet and the second connection sheet are connected through a via hole formed in the gate insulating layer; and
    the second end of the gate signal output line is connected to the jumper pad at a side of the jumper pad in the second direction, and the gate line is connected to the jumper pad at a side of the jumper pad away from the non-display region in the first direction.

2. The array substrate according to claim 1, wherein:
    the gate signal output line comprises a lead-out section and a transfer section, and each of the lead-out section and the transfer section comprises a first end and a second end, and the first end of the lead-out section is connected to the shift register, the second end of the lead-out section is connected to the first end of the transfer section, the second end of the transfer section is connected to the gate line through the jumper pad, and an angle between the transfer section and the gate line is within a range of 45° to 90°.

3. The array substrate according to claim 2, wherein the non-display region comprises a circuit region and a transfer region, the transfer region is located between the display region and the circuit region, the transfer section of the gate signal output line and the jumper pad are located in the transfer region, and the common electrode leading wire is provided in the transfer region.

4. The array substrate according to claim 2, wherein:
    the gate signal output line further comprises an intermediate section, a first end of the intermediate section is connected to the second end of the lead-out section, a second end of the intermediate section is connected to the first end of the transfer section, and an angle between the intermediate section and the transfer section is within a range of 30° to 60°.

5. The array substrate according to claim 4, wherein:
    the intermediate section has a straight-line shape or an arc shape.

6. The array substrate according to claim 1, further comprising:
    a data line, provided in a same layer as the gate signal output line.

7. The array substrate according to claim 1, wherein:
    the jumper pad is located on a side of the common electrode leading wire facing the gate line in the first direction.

8. The array substrate of claim 7, wherein:
    the second end of the gate signal output line is connected to the second connection sheet of the jumper pad at a side of the second connection sheet of the jumper pad in the second direction, and the gate line is connected to the first connection sheet of the jumper pad at a side of the first connection sheet of the jumper pad away from the non-display region in the first direction.

9. The array substrate of claim 7, wherein:
    the gate signal output line comprises a lead-out section and a transfer section, each of the lead-out section and the transfer section comprises a first end and a second end, and the first end of the lead-out section is connected to the shift register, the second end of the lead-out section is connected to the first end of the transfer section, the second end of the transfer section is connected to the gate line through the jumper pad, and an angle between the transfer section and the gate line is within a range of 45° to 90°, and
    in a direction parallel to the common electrode leading wire, a distance between an edge of the second connection sheet facing the lead-out section and an edge of the lead-out section facing the second connection sheet is greater than 18 µm.

10. The array substrate according to claim 1, further comprising:
    a connection line, provided in the non-display region and having a first end and a second end, wherein the first end of the connection line is connected to the gate line at a side of the gate line in the second direction perpendicular to the first direction, and the second end of the connection line is connected to the gate signal output line.

11. The array substrate according to claim 10, further comprising:
    a jumper pad, wherein the second end of the gate signal output line and the second end of the connection line are respectively at opposite first and second sides of the jumper pad in the second direction, and connected to each other through the jumper pad.

12. The array substrate according to claim 10, further comprising:
- a common electrode leading wire, provided in a same layer as the gate line, and extending in a direction crossing the gate line;
- a gate insulating layer covering the common electrode leading wire and the gate line, wherein the gate signal output line is provided on the gate insulating layer; and
- a jumper pad, comprising a first connection sheet and a second connection sheet, wherein the first connection sheet and the second connection sheet are connected through a via hole formed in the gate insulating layer, the second end of the gate signal output line is connected to the second connection sheet at a first side of the jumper pad in the second direction and the second connection sheet is provided in a same layer as the gate signal output line, and the second end of the connection line is connected to the first connection sheet at a second side, opposite to the first side, of the jumper pad in the second direction and the first connection sheet is provided in a same layer as the connection line and the gate line.

13. The array substrate of claim 12, wherein:
the connection line comprises a first connection line portion and a second connection line portion, a first end of the second connection line portion of the connection line is connected to the gate line, and a second end of the second connection line portion of the connection line is connected to a first end of the first connection line portion of the connection line, and a second end of the first connection line portion of the connection line is connected to the first connection sheet of the jumper pad.

14. The array substrate of claim 13, wherein:
the second connection line portion of the connection line has a straight-line shape, and an angle between the second connection line portion of the connection line and the first connection line portion is within a range of 30° to 60°, or the first connection line portion of the connection line and the gate line form an angle of 45° to 90° with each other.

15. The array substrate according to claim 1, wherein:
a size of the jumper pad in the first direction is smaller than a size of the jumper pad in the second direction.

16. A display panel, comprising:
the array substrate according to claim 1.

17. A display apparatus, comprising:
the display panel according to claim 16.

* * * * *